United States Patent
DiGiovanna

(10) Patent No.: US 7,451,929 B2
(45) Date of Patent: Nov. 18, 2008

(54) METHODS AND APPARATUS FOR MONITORING ELECTRICAL CONTACTS

(75) Inventor: Robert W. DiGiovanna, Shirley, NY (US)

(73) Assignee: Symbol Technologies, Inc., Holtsville, NY (US)

( * ) Notice: Subject to any disclaimer, the term of this patent is extended or adjusted under 35 U.S.C. 154(b) by 261 days.

(21) Appl. No.: 11/068,581

(22) Filed: Feb. 28, 2005

(65) Prior Publication Data

US 2006/0192015 A1    Aug. 31, 2006

(51) Int. Cl.
G06K 7/06    (2006.01)

(52) U.S. Cl. .............. 235/441; 235/462.01; 235/472.01

(58) Field of Classification Search ................ 235/454, 235/462.01, 462.09, 472.01, 441; 340/636.12, 340/636.2

See application file for complete search history.

(56) References Cited

U.S. PATENT DOCUMENTS

| | | | | |
|---|---|---|---|---|
| 4,967,188 A | * | 10/1990 | Collins, Jr. | 340/636.1 |
| 5,278,541 A | * | 1/1994 | Wicht et al. | 340/636.15 |
| 5,430,558 A | * | 7/1995 | Sohaei et al. | 358/473 |
| 5,510,735 A | * | 4/1996 | Mahabadi | 327/77 |
| 5,515,303 A | * | 5/1996 | Cargin et al. | 361/683 |
| 5,637,979 A | * | 6/1997 | Tamai et al. | 320/116 |
| 5,756,984 A | * | 5/1998 | Kobayashi | 235/462.45 |
| 5,856,660 A | * | 1/1999 | Bard et al. | 235/462.15 |
| 5,874,723 A | * | 2/1999 | Hasegawa et al. | 235/472.01 |
| 6,127,810 A | * | 10/2000 | Sato et al. | 320/148 |
| 6,149,062 A | * | 11/2000 | Danielson et al. | 235/472.01 |

* cited by examiner

Primary Examiner—Ahshik Kim
(74) Attorney, Agent, or Firm—Fay Kaplun & Marcin, LLP

(57) ABSTRACT

Methods and apparatus for monitoring electrical contacts comprising measuring a first voltage across a connection between a device and a base, charging a power source in the device, measuring a second voltage across the connection, determining a difference between the first voltage and the second voltage and initiating a signal alarm if the difference is greater than a predetermined threshold value. The device may be maintained by a management system.

18 Claims, 7 Drawing Sheets

METHODS AND APPARATUS FOR MONITORING ELECTRICAL CONTACTS

FIELD OF THE INVENTION

The invention is directed to electronic devices and, more particularly to methods and apparatus for monitoring electrical contacts.

BACKGROUND OF THE INVENTION

Wireless electronic devices such as cell phones, handheld scanners, mobile computers, electronic pets, etc. normally comprise a rechargeable power source, such as for example a battery. The electronic device can be recharged by coupling the device to an accompanying base or cradle. The base can draw power from another battery and/or an electrical outlet.

The connection between the device and base can be through corresponding electrical contacts located on the device and on the base that match when the device is placed on the base. Or in alternate embodiments, the device can be coupled to the base through electrical contacts in a wire. In some embodiments, the device and base can each have a plurality of contacts that perform different functions. For example some contacts can be used to charge the device's battery, while other contacts can be used to transfer data.

Unfortunately, device, base and wire contacts can begin to corrode due to wear, contamination, oxidation, etc. Additionally, particles, dirt or other objects can settle on the contacts and interfere with the connection between the device and its base. When this corrosion or interference is introduced, the resistance between the device and the base increases and the device may not charge properly or may not charge at all. This could result in unsatisfied end users who believed they charged their device but have not. In addition, improperly charging the device can also ruin its battery, adding to repair costs.

Accordingly, there is a desire for methods and apparatus that can monitor the connection between a device and its base. As the number of devices a customer owns increases, monitoring and maintaining the devices becomes increasingly difficult. For example a national retailer may own thousands of scanners and other mobile devices. Therefore, there is also a desire for the contact monitoring system to integrate with a management system.

SUMMARY OF THE INVENTION

The invention as described and claimed herein satisfies this and other needs, which will be apparent from the teachings herein. An embodiment of the invention includes methods and apparatus for monitoring electrical contacts of, for example, a device and its base.

An exemplary method of monitoring electrical contacts comprises measuring a first voltage across a connection between a device and a base, charging a power source in the device, measuring a second voltage across the connection, determining a difference between the first voltage and the second voltage and initiating a signal if the difference is greater than a predetermined threshold value.

In one embodiment of the invention the device can be a wireless handheld scanner. The scanner comprises electrical contacts on the bottom of its handle. The electrical contacts, when coupled to corresponding contacts on a base or cradle, are used to recharge the scanner's power source. Monitoring methods and apparatus implemented in accordance with the invention can monitor the contacts for corrosion or interference, and initiate a signal if a large enough voltage drop is detected.

In another embodiment of the invention, a device, such as, for example, a scanner, implemented in accordance with the invention, can be monitored by a management system. The cradle is coupled to a terminal, for example a point of sale (POS) terminal, and the terminal is coupled to a computer or server that monitors and maintains the system. When a scanner and/or cradle detects a large enough voltage drop across their connection, the scanner and/or cradle can be programmed to send a signal, such as, for example a warning message, to the monitoring computer. A system operator can then have the scanner serviced.

The scanner can also be programmed to display a message on a screen or emit an audible noise that can alert a scanner user that something is wrong with the connection to the cradle. Additionally, the scanner and/or cradle can stop charging in response to a connection signal.

Other objects and features of the invention will become apparent from the following detailed description, considering in conjunction with the accompanying drawing figures. It is understood however, that the drawings are designed solely for the purpose of illustration and not as a definition of the limits of the invention.

BRIEF DESCRIPTION OF THE DRAWING FIGURES

The drawing figures are not to scale, are merely illustrative, and like reference numerals depict like elements throughout the several views.

DETAILED DESCRIPTION OF EXEMPLARY EMBODIMENTS

There will now be shown and described in connection with the attached drawing figures several exemplary embodiments of methods and apparatus for monitoring electrical contacts.

Electronic devices often comprise rechargeable batteries as power supplies. The devices can comprise electrical contacts that can be used to connect the device to a base or a wire that can provide electrical power. Unfortunately, the electrical contacts that connect the device and the base can become corroded and/or dirty, thus impeded the charging process, and possibly damaging the battery. In one embodiment of the invention, the device and/or base can monitor the connection between the electrical contacts and warn the device owner and/or user to repair or clean the electrical contacts if improper charging is occurring.

Figure 1:
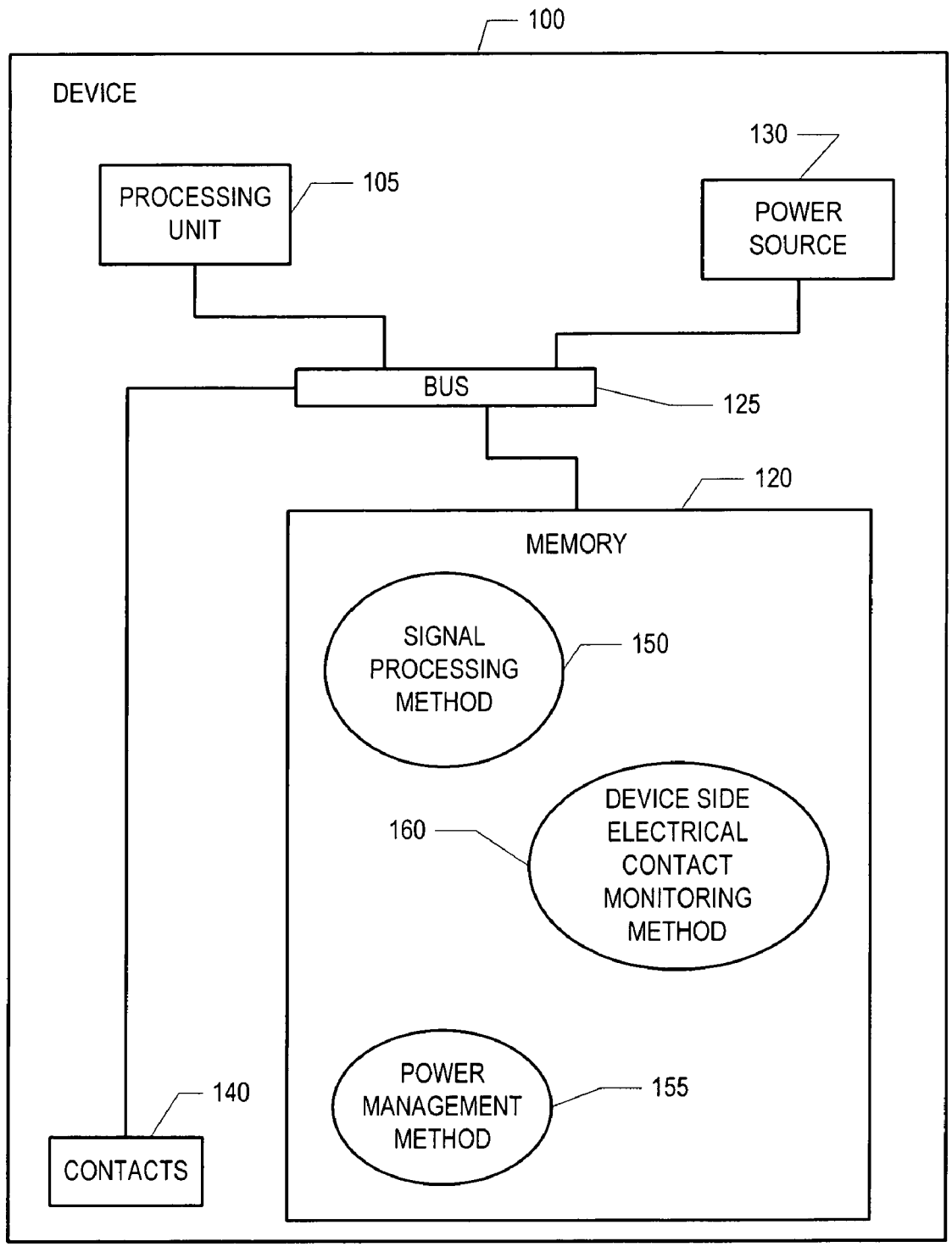
FIG. 1 illustrates and exemplary device implemented according to an embodiment of the invention.

FIG. 1 illustrates an exemplary device 100 implemented in accordance with the invention. The device 100 can be, in exemplary embodiments, a handheld scanner, a mobile computer, a cell phone etc. The device 100 comprises a processing unit 105, a power source 130, contacts 140 and memory 120 coupled together by bus 125. The modules of data capture module 100 can be implemented as any combination of software, hardware, hardware emulating software, and reprogrammable hardware. The bus 125 is an exemplary bus showing the interoperability of the different modules of the invention. As a matter of design choice there may be more than one bus and in some embodiments certain modules may be directly coupled instead of coupled to a bus 125. Additionally some modules may be combined with others.

When the device 100 is used in a mobile mode, the device 100 can receive power from power source 130, which can be a rechargeable battery or another source of electrical power. In addition, power source 130 can be a plurality of different power modules that work in conjunction or in a back up configuration. The device can recharge its power source through contacts 140. Contacts 140 can be, for example, exposed metal strips that align with contacts on a base, contacts in a slot for a wire that connects to a base, an electrical outlet, etc. In addition to contacts 140 for recharging, device 100 can have additional contacts 140 that can be used for other purposes, such as, for example, communicating with the base.

Processing unit 105 can be implemented as, in exemplary embodiments, one or more Central Processing Units (CPU), Field-Programmable Gate Arrays (FPGA), etc. In an embodiment, the processing unit 105 can comprise a general purpose CPU that processes software and raw image data stored in memory 120. In other embodiments, modules of the processing unit 105 may be preprogrammed or hardwired in the processing unit's 105 memory to perform functions, such as, for example, signal processing, etc. In alternate embodiments, one or more modules of processing unit 105 can be implemented as an FPGA that can be loaded with different processes, for example, from memory 120, and perform a plurality of functions. Processing unit 105 can comprise any combination of the processors described above.

Memory 120 can be implemented as volatile memory, non-volatile memory and rewriteable memory, such as, for example, Random Access Memory (RAM), Read Only Memory (ROM) and/or flash memory. The memory 120 stores methods and processes used to operate the device 100. Different devices perform different functions, thus different devices store different methods in memory. An exemplary device, such as, for example, a handheld scanner, can comprise a signal processing method 150, a device side electrical contact monitoring method 160, and a power management method 155. The memory 120 can also be used to store data, and as mentioned above, memory 120 can be part of processing unit 105.

In a scanner, when a decoding operation is initiated, for example, a trigger is pressed, the scanner 100 reads a target dataform, for example, a barcode, and analyzes the dataform. Signal processing method 150 is used by the scanner to decode dataforms. The scanner can be a laser scanner, imaging scanner, etc.

Power management method 155 manages the power used by a device 100. In some embodiments, the device 100 can switch to a power save mode, when no activity is detected for a given amount of time. The power save mode can completely shut down the device 100 or alternatively, it can slow down device operations, or initiate other power saving techniques.

In accordance with an embodiment of the invention, device 100 comprises device side electrical contact monitoring method 160. The contact monitoring method 160 monitors the connection between a device 100 and a base, to determine if the contacts on the device and/or base need servicing. In some embodiments of the invention, the contact monitoring method 160 and any hardware needed to perform the method 160 are completely located in the device 100. In other embodiments, the method 160 and any accompanying hardware is located completely in a base. Still in other embodiments, the processes and hardware components can be divided between the device 100 and a base. Additionally, some processes and/or components can be performed and/or located at a remote machine, for example, with the results being communicated back to the device 100 or some other managing computer through a communications link. An exemplary contact monitoring method will be described in detail with the description of FIG. 3 below.

The exemplary embodiment of FIG. 1 illustrates signal processing method 150, device side electrical contact monitoring method 160 and power management method 155 as separate components, but these methods are not limited to this configuration. Each method described herein in whole or in part can be separate components or can interoperate and share operations. Additionally, although the methods are depicted in the memory 120, in alternate embodiments the methods can be incorporated permanently or dynamically in the memory of processing unit 105.

Memory 120 is illustrated as a single module in FIG. 1, but in some embodiments device 100 can comprise more than one memory module. For example, the methods described above can be stored in separate memory modules.

Figure 2:
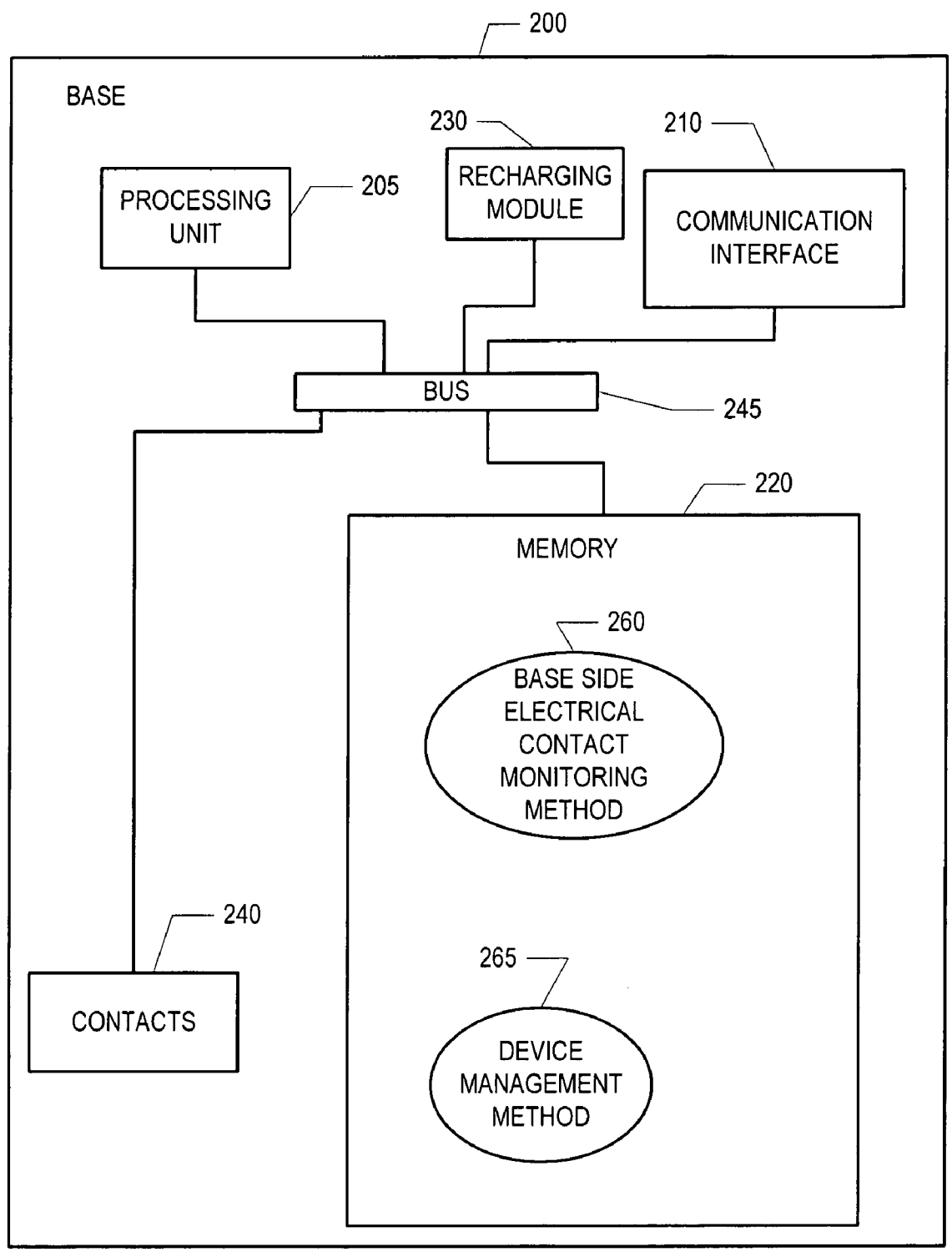
FIG. 2 illustrates an exemplary base implemented according to an embodiment of the invention.

FIG. 2 illustrates an exemplary base 200 implemented in accordance with an embodiment of the invention. The base 200 comprises a processing unit 205, recharging module 230, communication interface 210, contacts 240 and memory 220 coupled together by bus 245. As with the device 100, the bus 245 of the base 200 illustrates the interoperability of the modules of base 200. In other embodiments, some modules of the base may be directly coupled together and/or incorporated within one another.

The processing unit 205 and the contacts 240 can be similar to the processing unit and contacts of the device 100. The level of "intelligence" of the base 200 is variable, and the number of modules that are in the base 200 can correspond directly to the intelligence of the base 200, or in other embodiments an exemplary base with a plurality of features can be made to emulate a base with less features. For example, in some embodiments, the base 200 can perform only a recharging function through recharging module 230. In other embodiments, the base 200 can additionally provide a communication link to a managing computer through communication interface 210.

The base 200 can also be modified to perform device management through device management method 265. Device management can include, for example, address pairing between a base 200 and a device 100. In addition, in some embodiments the base 200 can perform some or all of a contact monitoring method of the invention through base side electrical contact monitoring method 260. Device management method 265 and base side electrical contact monitoring method 260 are stored in memory 220. Memory 220 can be similar to the memory 120 of device 100.

Figure 3:
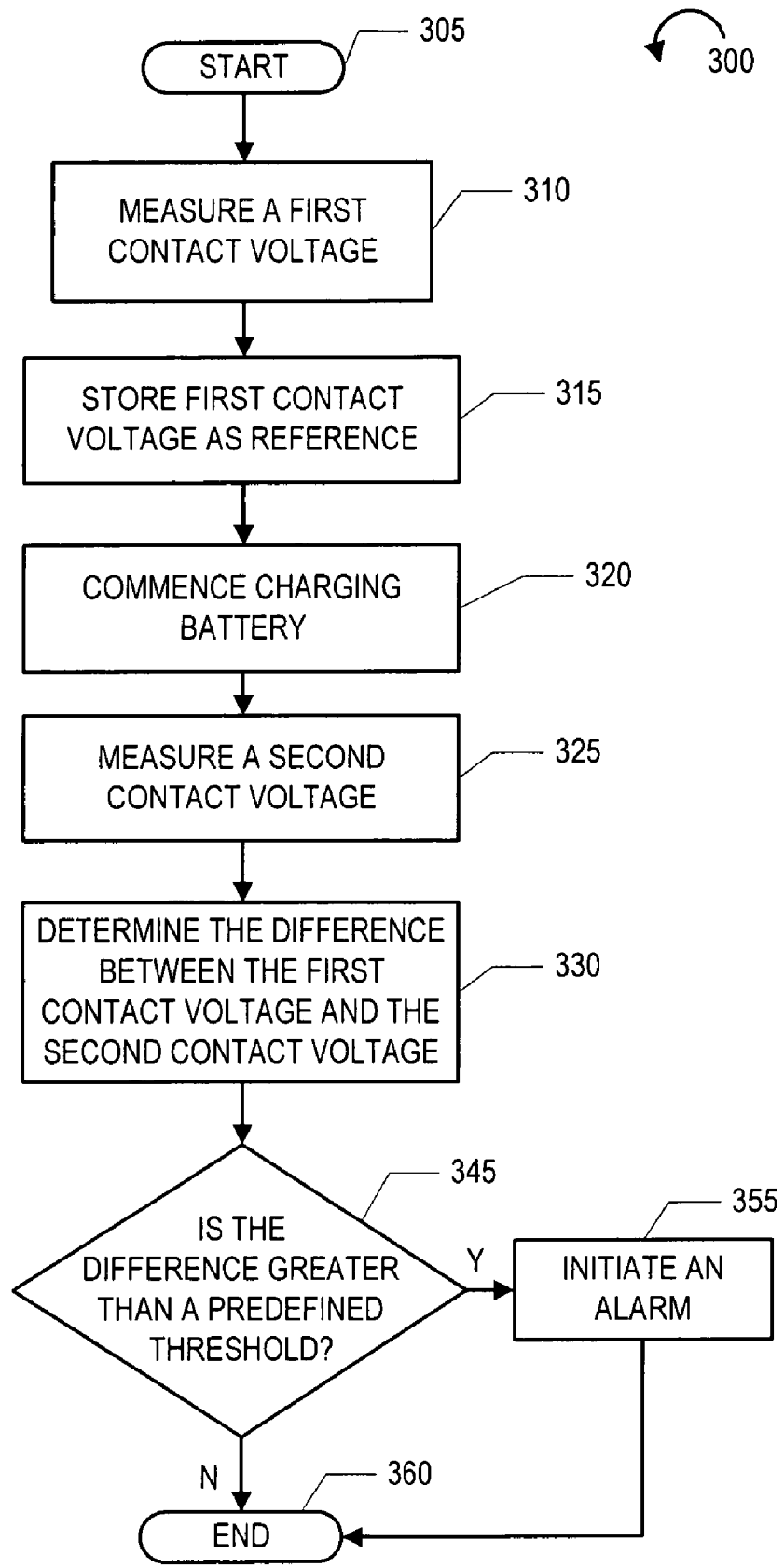
FIG. 3 illustrates an exemplary contact monitoring method implemented according to an embodiment of the invention.

FIG. 3 illustrates an exemplary contact monitoring method 300 implemented in accordance with an embodiment of the invention. The method 300 is described as operating from a device 100, but as mentioned earlier, some or all of the operations of the method 300 can be performed in a base 200 or even at a remote location. Additionally, the steps of method 300 can be reordered in alternate embodiments. An exemplary operation of method 300, can start in step 305 when, for example, a device 100 detects that is has been coupled to a base 200. Modules in the device 100 and/or base 200 can detect when a device 100 and base 200 are coupled together without starting to charge the power source in the device 100.

Following step 305 processing proceeds to step 310, where the device 100 takes a first measurement of the contact voltage and stores the value. In an exemplary embodiment, the voltage measurement can be converted to a digital signal using an analog to digital converter and stored in memory. Then, processing proceeds to step 320 where the device 100 starts to charge its battery 130. Following step 320, in step 325, the device takes a second measurement of the contact voltage.

After the device 100 takes the second contact voltage measurement, processing proceeds to step 330, where the device 100 determines the difference between the first contact voltage and the second contact voltage. In step 345, if the determined difference is not greater than a predetermined threshold value, processing proceeds from step 345 to step 360, where the method 300 ends and the device continues to charge its power source 130. In some embodiments the device 100 may send a message to a managing computer indicating that the contacts are in good condition.

Returning to step 345, if the difference between the first voltage and the second voltage is greater than a predetermined threshold. Processing proceeds to step 355, where the device 100 initiates a signal, such as, for example, an alarm. The alarm can take many forms. For example, the alarm can be an audible beep, it can be a warning message to a managing computer, it can be a message to the base and/or a terminal to display a message to the user, it can be a command to the device 100 to display a message, etc. The alarm informs a user, manager and/or owner of a device 100, that the connection between the device 100 and its base 200 needs servicing. Servicing the device 100 and/or base 200 can include cleaning or replacing the contacts or wire. Following step 355, the method 300 ends in step 360.

In the exemplary monitoring method 300, there is one threshold level, but in alternate embodiments of the invention, there can be different levels of alarms depending on the magnitude of the voltage difference. For example, a larger voltage difference can elicit a more immediate response for the device user.

Figures 4, 5:
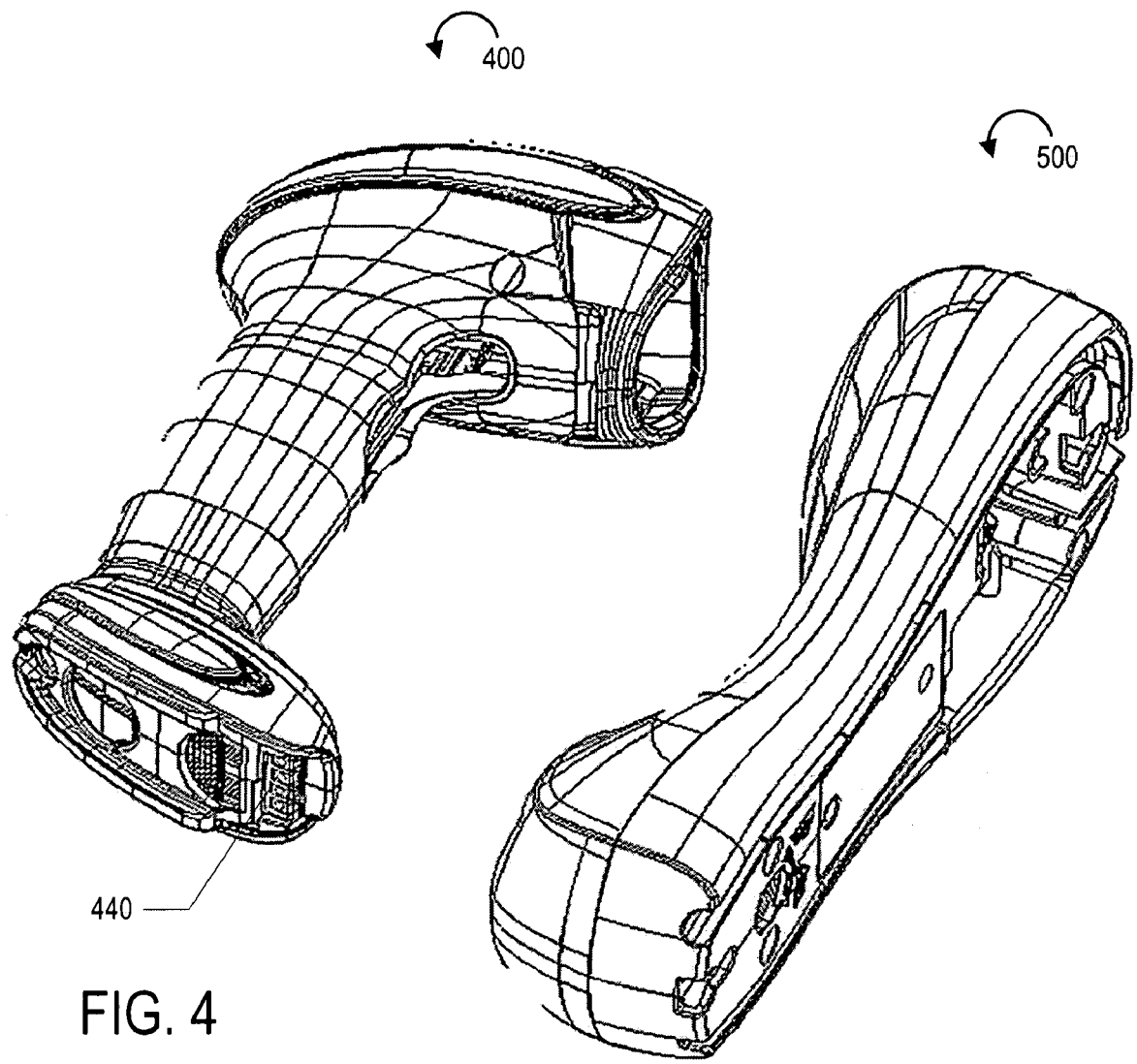
FIG. 4 illustrates an exemplary scanner implemented according to an embodiment of the invention.
FIG. 5 illustrates an exemplary cradle implemented according to an embodiment of the invention.

FIGS. 4-7 illustrate an exemplary scanner 400 and cradle 500 implemented in accordance with an embodiment of the invention. FIG. 4 illustrates a wire frame diagram of an exemplary scanner 400. The scanner 400 comprises four contacts 440 on the bottom of it handle. Two of the contacts are used to recharge the scanner's 400 power source and the other two contacts are used to transfer data between the scanner 400 and the cradle 500.

Figure 6:
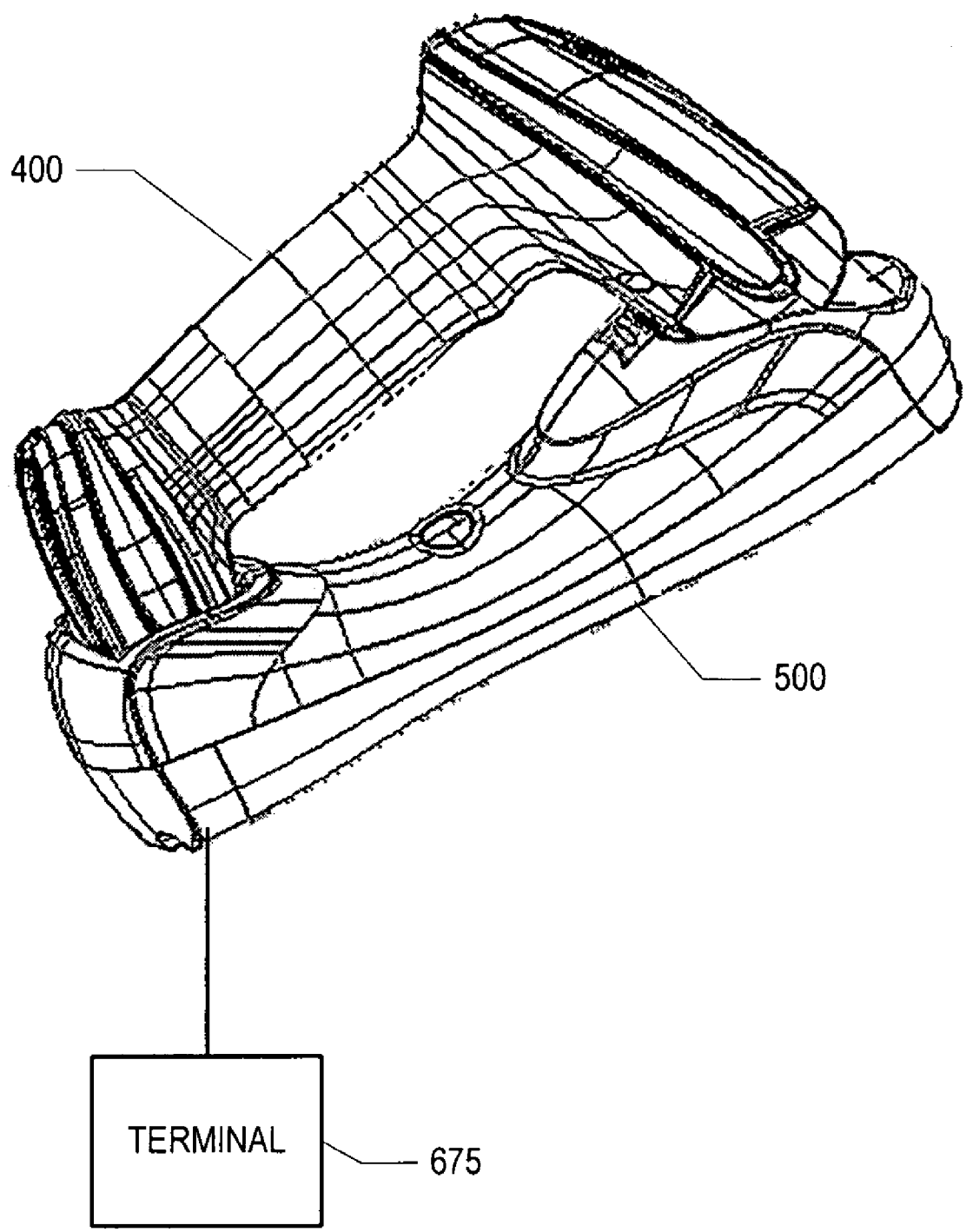
FIG. 6 illustrates the scanner of FIG. 4 coupled to the cradle of FIG. 5.

FIG. 5 illustrates an exemplary cradle 500 implemented in accordance with an embodiment of the invention. The base 500 comprises a first receiving structure positioned on the top of the cradle 500 for receiving the head of the scanner 400 and a second receiving structure positioned at the bottom of the cradle 500 for receiving the handle of the scanner. The second receiving structure comprises four contacts (not shown) that correspond to the contacts 440 on the bottom of the scanner 400. When the scanner 400 is place in the cradle 500 as illustrated in FIG. 6, the contacts 440 of the scanner 100 and the contacts of the cradle 500 are aligned to form a connection. As mentioned above the connection can be used to transfer data to and from the device 400 and to charge the power source of the device 400. Additionally, when the scanner 400 is coupled to the cradle 500, a contact monitoring operation can begin to determine if the contacts are working properly.

As illustrated in FIG. 6, the base can be coupled to a terminal 675, such as for example a POS terminal. The POS terminal 675 can be coupled to another computer from which it receives product information, updates, etc. During a contact monitoring operation, if the difference between the contact voltage before charging and after charging is greater than a threshold value, the device can send an alarm to the terminal 675 through the base 500. In an embodiment, the terminal 675 can display a message to the terminal user that the connection between the scanner 400 and the cradle 500 should be serviced. Additionally or alternatively, the message can be forwarded to a managing computer. The managing computer allows a small number of people to monitor and maintain a plurality of devices.

Figure 7:
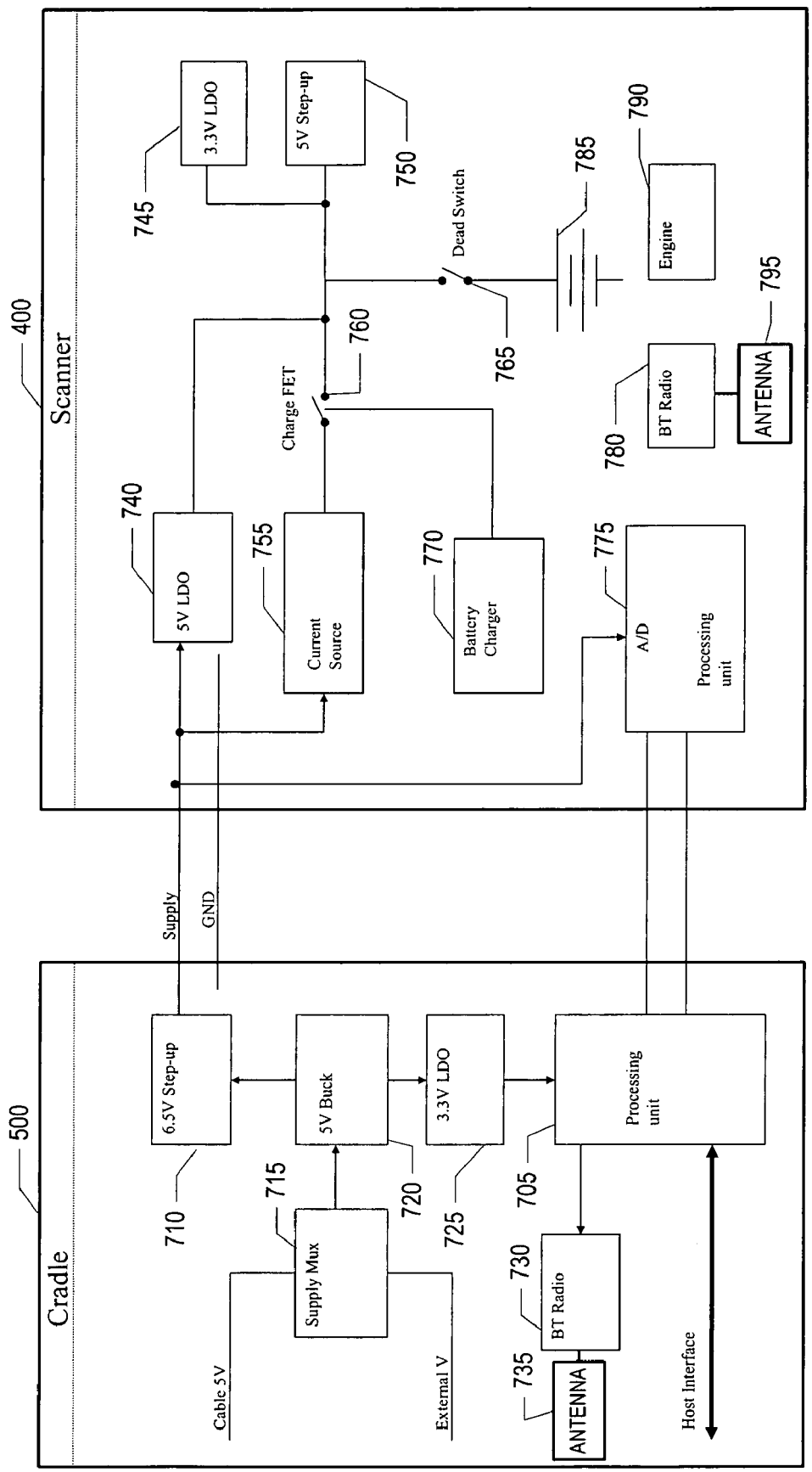
FIG. 7 illustrates a block diagram illustrating exemplary modules of the scanner and cradle of FIGS. 4 and 5.

FIG. 7 illustrates an exemplary block diagram of scanner 400 and cradle 500. Cradle 500 comprises a 6.5V step-up module 710, a supply mux 715, a 5 volt buck 720, a 3.3V LDO (low dropout) regulator 725, a processing unit 705, a radio 730 and an antenna 735. The scanner 400 comprises a 5V LDO 740, a current source 755, a battery charger 770, a charge FET 760, a dead switch 765, a battery 785, a 3.3V LDO 745, a 5V step-up 750, a processing unit 775, a scan engine 790, a radio 780 and an antenna 795.

The cradle can obtain power from a plurality of different sources. For example, power can be supplied from a 5V cable, such as, for example, a USB cable, coming from the terminal, or power can be supplied by an external power source, such as for example from an electrical outlet or from another battery. The supply mux 715 detects which line is providing the cradle with power and sends the power to 5V buck regulator 720, which maintains a 5V voltage.

The 5V buck 720 is coupled to the 6.5V step-up 710 and the 3.3V LDO 725. The 6.5 V step-up is coupled to the cradle's 500 contacts which are coupled to the contacts of the scanner 400. One contact can be a supply line while the other contact can be a ground. The 3.3V LDO is coupled to the processing unit 705. The processing unit 705 is coupled to the radio 730, and the radio 730 is coupled to an antenna 735. The cradle can use the radio 730 and antenna 735 to communicate with the scanner 400 when the scanner is operating in a mobile mode. The exemplary cradle 500 of FIG. 7 also comprises a processing unit 705 that has a connection to a host interface. The host interface can be a POS terminal. In alternate embodiments the cradle can communicate with a host terminal using the radio 730 and antenna 735.

The processing unit 705 can also be coupled to the contacts of cradle 500. When a scanner 400 is placed in the cradle 500 the contacts of the cradle 500 make a connection with the contacts of the scanner 400. The contacts of the scanner are coupled to a processing unit 775 in the scanner 400. Thus, the cradle 500 and the scanner 400 can communicate information between each other through this connection.

As mentioned above, the scanner 400 also has two contacts for receiving power from the cradle 500. The supply line is coupled to the 5V LDO 740, the current source 755 and an analog to digital converter in the processing unit 775. The current source 755 is coupled to one prong of the charge FET 760, the 5V LDO 740 is coupled to a second prong of the charge FET 760 and the battery charger 770 is coupled to a third prong of the charge FET 760. The second prong of the charge FET 760 is also coupled to a bus coupling the 3.3V LDO 745, the 5V step-up 750 and the dead switch 765. The other end of the dead switch 765 is coupled to the scanner's 400 power source 785.

The connections between the modules in the scanner 400 and the cradle 500 are exemplary and may not be complete. Additional communications channels can exist between the various modules of the scanner 400 and the cradle 500 as will be discussed below.

The 3.3V LDO 745 provides a consistent 3.3 volts to the processing unit 775 and the radio 780, while the 5V step-up 750 provides power to the scan engine 790. The scanner 400 can use the radio 780 and the antenna 795 to communicate with the base 500 when the scanner 400 is in a mobile mode.

An exemplary contact monitoring operation can begin when a scanner 400 is placed in a cradle 500. The supply mux 715 supplies power to the 6.5V step-up 710. Before the scanner 400 begins to charge its battery 785, the processing unit 775 measures the voltage across the contacts and digitally stores the value. For example, an exemplary measured voltage can be very close to 6.5V. The battery charger 770 turns on the charge FET 760, and the battery begins to charge.

After the battery begins to charge, the processing unit 775 takes a second measurement of the contact voltage. If the connection is working properly, the second voltage measurement will be slightly lower than the first measurement, for example 6.3V. Thus, the difference between the contact voltages is 0.2V. If the contacts are corroded and/or dirty there is a resistance in the connection, and the second voltage measurement is appreciably less than the first measurement, for example 4V. Thus, the difference between the voltages is 2.5V.

If the difference between the first voltage measurement and the second voltage measurement is greater than a threshold value, such as, for example 1 volt, then the connection between the scanner 400 and the cradle 500 needs servicing. The processing unit 775 can send an alarm to the cradle 500 and/or initiate an audible alarm and/or perform some other action to obtain the service for the scanner 400 and/or the cradle 500.

Figure 8:
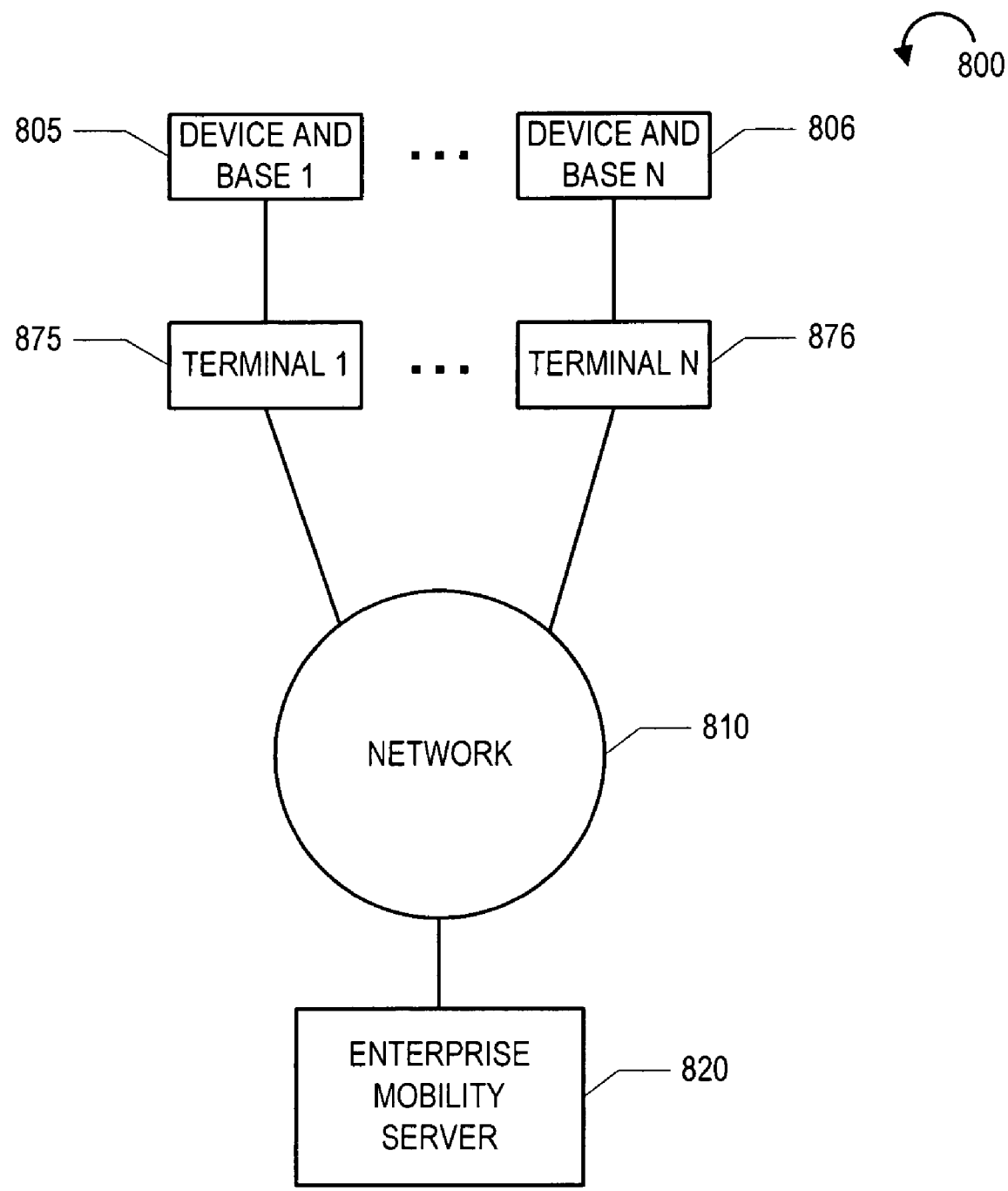
FIG. 8 illustrates an exemplary enterprise mobility network implemented according to an embodiment of the invention.

FIG. 8 illustrates an exemplary enterprise system 800 implemented in accordance with an embodiment of the invention. The system comprises a plurality of devices and bases, i.e., device and base 1 805 through device and base N 806. Device and base 1 805 is coupled to terminal 1 875, and device and base N is coupled to terminal N 876. The terminals 875, 876 are coupled to a network 810. The network is coupled to a managing computer, such as, for example, an enterprise mobility server 820.

The system 800 can take a plurality of forms. For example, the network 810 can be a local network, and the enterprise mobility server 820 can be positioned within a store. In one embodiment, the terminals 875, 876 receive barcode information from the device and then retrieve corresponding pricing and other information from the enterprise mobility server 820. Additionally, the enterprise mobility server 820 can send and receive monitoring and maintenance messages to and from the terminals 875, 876 and devices 805, 806. Thus, the contact monitoring operation of the invention can be part of a broader service for monitoring and maintaining a plurality of devices. For example when the threshold voltage is exceeded a message can be sent to the enterprise mobility server 820, for later review and/or immediate servicing.

In alternate embodiments, the enterprise mobility server 820 can be coupled to the Internet or some other private network and contact monitoring messages can be sent to another managing computer. Or alternatively, the network 810 can be the Internet and the enterprise mobility server 820 is located off site from the store. The contact monitoring method of the invention can be modified to work with these and any other device management network.

While there have been shown and described and pointed out fundamental novel features of the invention as applied to preferred embodiments thereof, it will be understood that various omissions and substitutions and changes in the form and detail of the disclosed invention may be made by those skilled in the art without departing from the spirit of the invention. It is the intention, therefore, to be limited only as indicated by the scope of the claims appended hereto.

What is claimed:

1. A method of monitoring electrical contacts comprising:
measuring a first voltage across a connection between a device and a base;
charging a power source in said device;
measuring a second voltage across said connection;
determining a difference between said first voltage and said second voltage; and
initiating an alarm signal if said difference is greater than a predetermined threshold value.

2. The method of claim 1, further comprising:
converting said measured voltage from an analog value to a digital value; and
storing said digital value in memory.

3. The method of claim 1, wherein said device is a scanner.

4. The method of claim 1, further comprising transmitting said alarm signal to a management system.

5. The method of claim 4, further comprising receiving a message from said management system and initiating an action.

6. The method of claim 5, wherein said action comprises initiating a perceivable warning.

7. The method of claim 1, further comprising initiating a perceivable warning in response to an initiated signal.

8. The method of claim 7, wherein said perceivable warning is an audible warning.

9. The method of claim 1, wherein said base is a recharging base and said base is coupled to a terminal.

10. The method of claim 1, further comprising ceasing to charge said power source in response to an initiated signal.

11. An electrical contact monitoring system comprising:
memory including a monitoring process comprising:
measuring a first voltage across a connection between a device and a base,
charging a power source in said device,
measuring a second voltage across said connection,
determining a difference between said first voltage and said second voltage, and
initiating an alarm signal if said difference is greater than a predetermined threshold value.

12. The system of claim 11, further comprising an analog to digital converter and wherein said process further comprises:
converting said measured voltage from an analog value to a digital value; and
storing said digital value in memory.

13. The system of claim 11, wherein said device is a scanner.

14. The system of claim 11, wherein said base is coupled to a management system and wherein said process further comprises transmitting said alarm signal to said management system.

15. The system of claim 11, further comprising a perceivable warning module.

16. The system of claim 15, wherein said perceivable warning module is a speaker.

17. A scanner comprising:
a scan module;
electrical contacts;
a power source; and
memory including a monitoring process comprising,
- measuring a first voltage across a connection between a device and a base,
- charging a power source in said device,
- measuring a second voltage across said connection,
- determining a difference between said first voltage and said second voltage, and
- initiating an alarm signal if said difference is greater than a predetermined threshold value.

18. The scanner of claim 17, wherein said process further comprises ceasing to charge said power source in response to an initiated signal.

* * * * *